United States Patent [19]
Chang

[11] Patent Number: 5,311,047
[45] Date of Patent: May 10, 1994

[54] AMORPHOUS SI/SIC HETEROJUNCTION COLOR-SENSITIVE PHOTOTRANSISTOR

[75] Inventor: Chun-Yen Chang, Tainan, Taiwan

[73] Assignee: National Science Council, Taiwan

[21] Appl. No.: 272,239

[22] Filed: Nov. 16, 1988

[51] Int. Cl.[5] ............ H01L 29/161; H01L 29/205; H01L 29/225
[52] U.S. Cl. ........................... 257/198; 257/53; 257/55; 257/63; 257/77; 257/187; 257/587; 257/591
[58] Field of Search ............ 357/34, 2, 16, 58; 437/100; 257/53, 55, 63, 77, 187, 197, 198, 587, 591, 592

[56] References Cited

U.S. PATENT DOCUMENTS

| | | | |
|---|---|---|---|
| 4,385,200 | 5/1983 | Hamakawa et al. | 352/2 |
| 4,600,935 | 7/1986 | Dresner | 357/2 |
| 4,633,287 | 12/1986 | Yamazaki | 357/34 |
| 4,665,428 | 3/1987 | Hockley et al. | 357/2 |
| 4,728,997 | 3/1988 | Szydlo et al. | 352/2 |
| 4,736,234 | 4/1988 | Boulitrop et al. | 357/2 |
| 4,820,915 | 4/1989 | Hamakawa et al. | 357/2 |
| 4,847,215 | 7/1989 | Hanaki et al. | 437/100 |

*Primary Examiner*—Ngan Ngo
*Attorney, Agent, or Firm*—Bacon & Thomas

[57] ABSTRACT

An amorphous Si/SiC heterojunction color-sensitive phototransistor was successfully fabricated by plasma-enhanced chemical vapor deposition. The structure is glass/ITO/a-Si($n^+$-i-$p^+$)/a-SiC(i-$n^+$)/Al. The device is a bulk barrier transistor with a wide-bandgap amorphous SiC emitter. The phototransistor revealed a very high optical gain of 40 and a response speed of 10 us at an input light power of 5 uW and a collector current of 0.12 mA at a voltage of 14 V. The peak response occurs at 610 nm under 1 V bias and changes to 420 and 540 nm under 7- and 13-V biases, respectively.

3 Claims, 5 Drawing Sheets

AMORPHOUS SI/SIC HETEROJUNCTION COLOR-SENSITIVE PHOTOTRANSISTOR

BACKGROUND OF THE INVENTION

Recently, amorphous semiconductor photosensors prepared by a radio-frequency glow discharge method have been developed for large-area low-cost thin-film image sensors, for example, for the contact-type linear sensor of a compact facsimile machine, or for the photoreceptor of a laser beam printer.

Basically, there are two kinds of a-Si:H photosensors, namely, Schottky or the p-i-n photodiode and the photoconductor type. However, both of these kinds of photosensors suffer from low photocurrent output and low S/N ratio, due to a lack of amplification. Recently, we have demonstrated that the amorphous silicon n+-i-(p+)-i-n+ thin-film bulk barrier phototransistor exhibits high gain and high response speed. In this specification, the successful development of a new type of glass-/ITO/a-Si(n+-i-p+)/a-SiC(i-n+)/Al heterojunction bulk barrier phototransistor with wide-bandgap a-SiC emitter is described. This is an alternative type of the recently reported glass/ITO/a-SiC(n+-i-p+)/a-/Si(i-n+)/Al device.

SUMMARY OF THE INVENTION

This invention relates to an amorphous Si/SiC heterojunction color-sensitive phototransistor which comprises glass/ITO/a-Si(n+-i-p+)/a-SiC(i-n+)/Al, having high optical gain and response speed. The color sensitive phototransistor of this invention is a kind of majority-carrier device and has very high optical gain in weak light illumination. Therefore, it is very suitable for use as a sensitive light detector. Moreover, the voltage-dependent and thickness-dependent photo I-V characteristics enable a more flexible design for a voltage-controlled color detector.

DETAILED DESCRIPTION OF THE PREFERRED EMBODIMENTS

Figure 1:
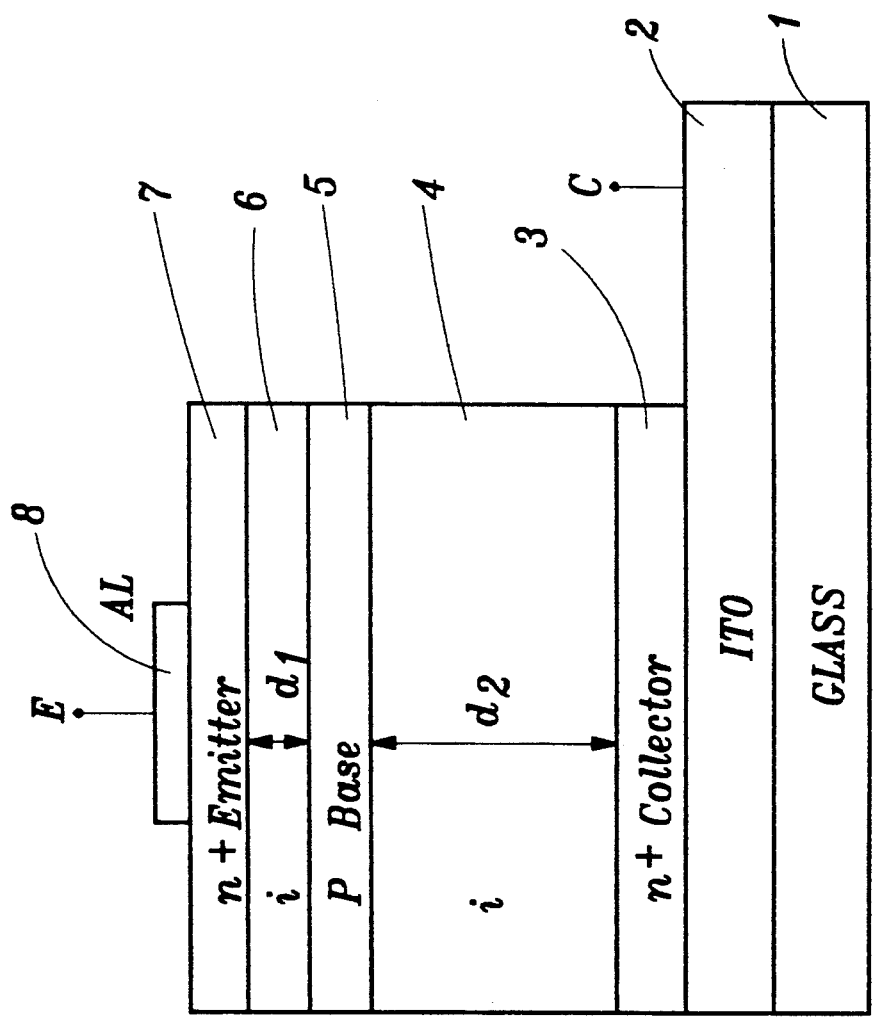
FIG. 1 is a cross-sectional view of a phototransistor according to a preferred embodiment of the present invention.
Figure 2:
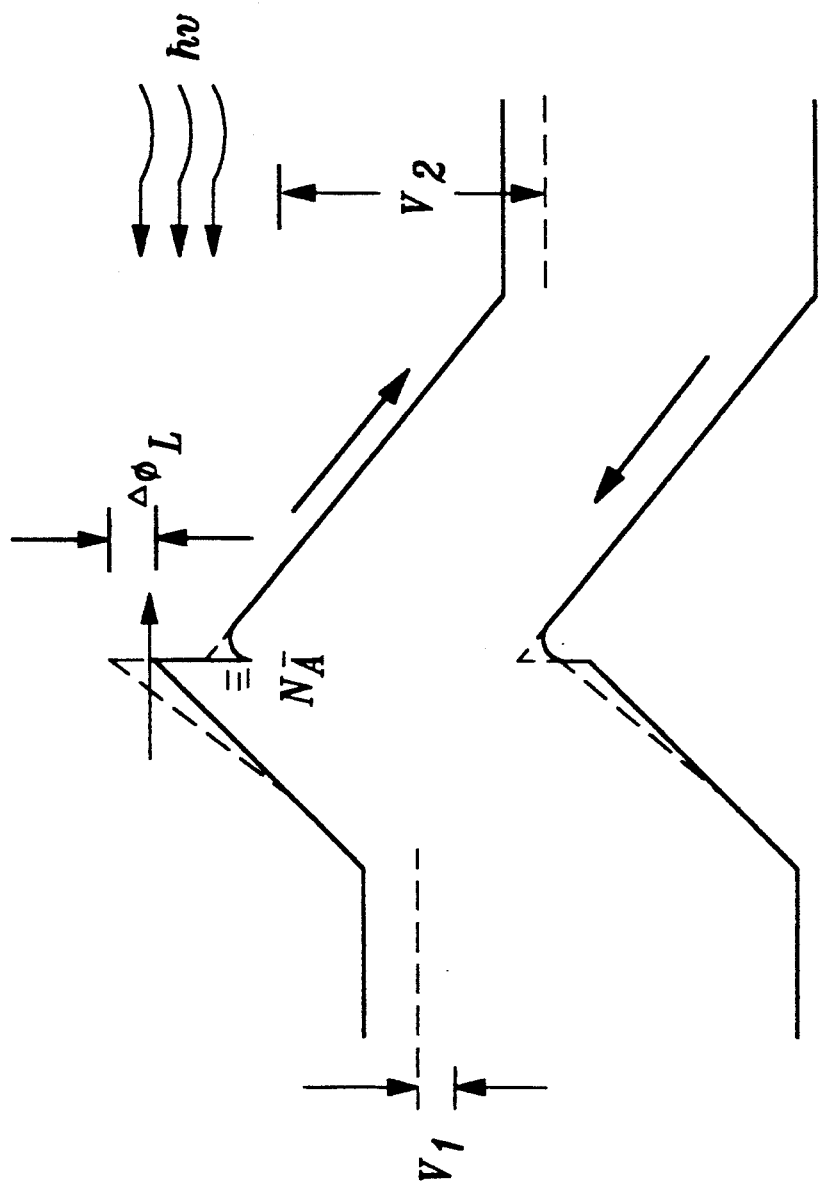
FIG. 2 is a band diagram for the preferred phototransistor.

Amorphous SiC:H films with a wide bandgap can be prepared by plasma decomposition of the gas mixture of silane and hydrocarbon. This material is therefore often used as the window material in a-Si p-i-n solar cells to enhance collection efficiency. Thus various kinds of a-Si/a-SiC heterojunctions can be made. The preferred structure, shown in cross-section in FIG. 1, is a heterojunction phototransistor. It includes, in order, the following layers: a glass plate 1, an ITO coating 2 which forms the collector electrode, n+ layer 3, undoped collector layer 4 having thickness $d_2$, p+ base layer 5, undoped emitter layer 6 having thickness $d_1$, n+ emitter layer 7, and AL emitter electrode 8. The fabrication processes are as follows: After the substrate cleaning process, a-Si and a-SiC n+-i-p+-i-n+ multilayers 3-7 are subsequently deposited on the ITO-coated glass plate in a plasma-enhanced chemical vapor deposition system. The growth pressure and the substrate temperature are 1 torr and 250° C., respectively. The radio-frequency power is 0.087–0.144 w/cm². For the growth of a-SiC, 55-percent (volume fraction) $CH_4$ gas is added to the $SiH_4$ gas. The thickness $d_1$ of the undoped layer 6 on the emitter side is varied from 100 to 500 Å, whereas the collector undoped layer thickness $d_2$ is changed from 2000 to 7000 Å. The thin base layer is 100 Å. The device design rule demands that the regions between the two n+ layers be depleted of free carriers at all bias conditions, according the band diagram of the device is shown in FIG. 2. Photogenerated holes accumulated at the barrier valley (base) produce a barrier lowering. This in turn induces a large amount of electron injection over the barrier which results in an increase of the collector current.

Figure 3:
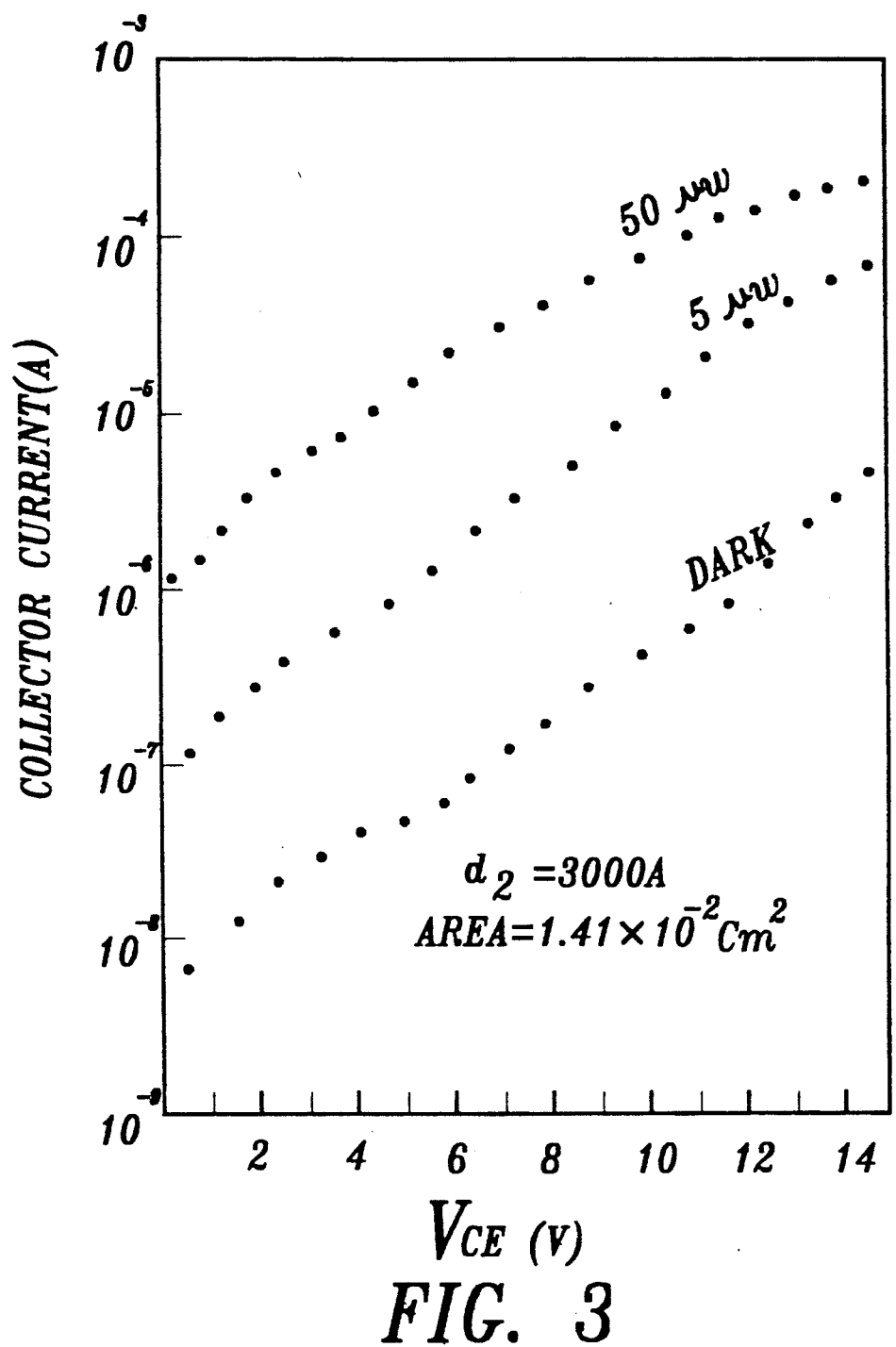
FIG. 3 is a graph of the I-V characteristic curves for the preferred phototransistor using the incident light power as a parameter.
Figure 4:
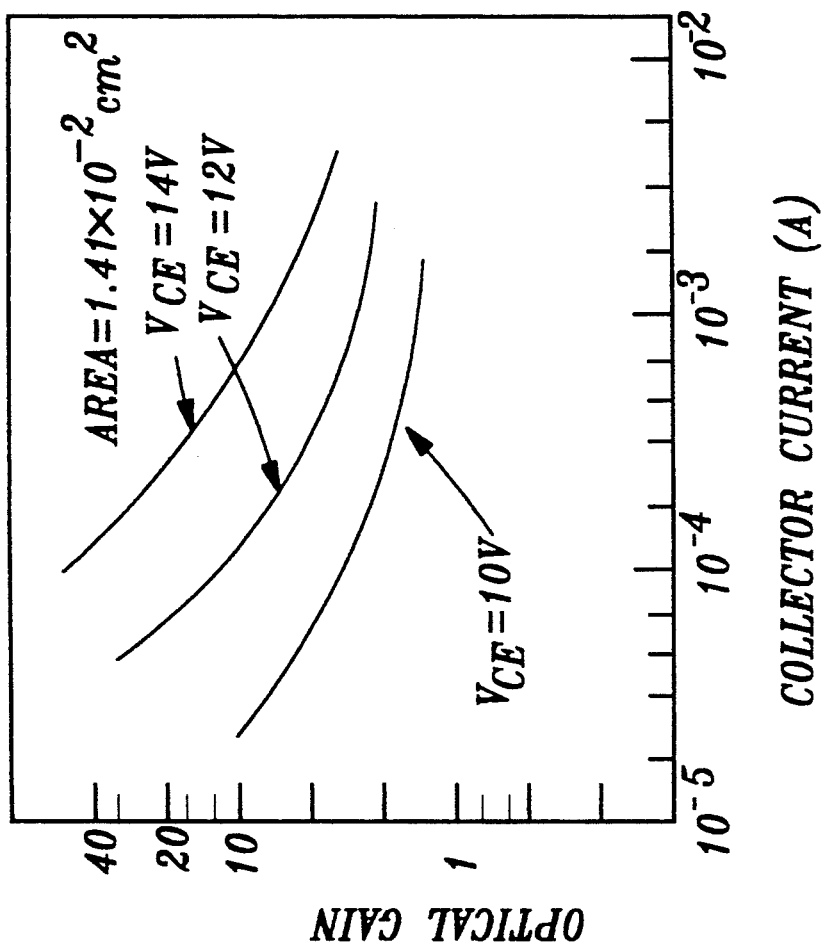
FIG. 4 shows the relationship between the optical gain G and the collector current of the preferred phototransistor using $V_{CE}$ as parameter.

Normally, the device is operated with the collector electrode positively biased with respect to the emitter electrode, and light is introduced through the glass substrate. FIG. 3 shows the I-V characteristics of the phototransistor both under photo and dark condition. The device area is $1.41 \times 10^{-2}$ cm². The bias voltage is changed from 1 to 14 V. Then the photocurrent $I_c$ is measured under illumination of a He-Ne laster ($\lambda = 6328$ Å), where the optical power is attenuated by a variable beam splitter and is calibrated by a photometer. The dc optical gain G is defined as $G = (hv/g)(I_c/P_{in})$, where q is the electronic charge, $P_{in}$ is the incident optical power, and hv is the energy of the incident radiation. The value of G increases with decreasing input power, which is a unique property of majority-carrier photodetectors, reaching a value of 40 for $P_{in} = 5$ uW, and $I_c = 0.121$ mA at $V_{CE} = 14$ V, as shown in FIG. 4. The dependence of G on illumination intensity can be attributed to the modulation of barrier height by photogenerated hole flux.

Figure 5:
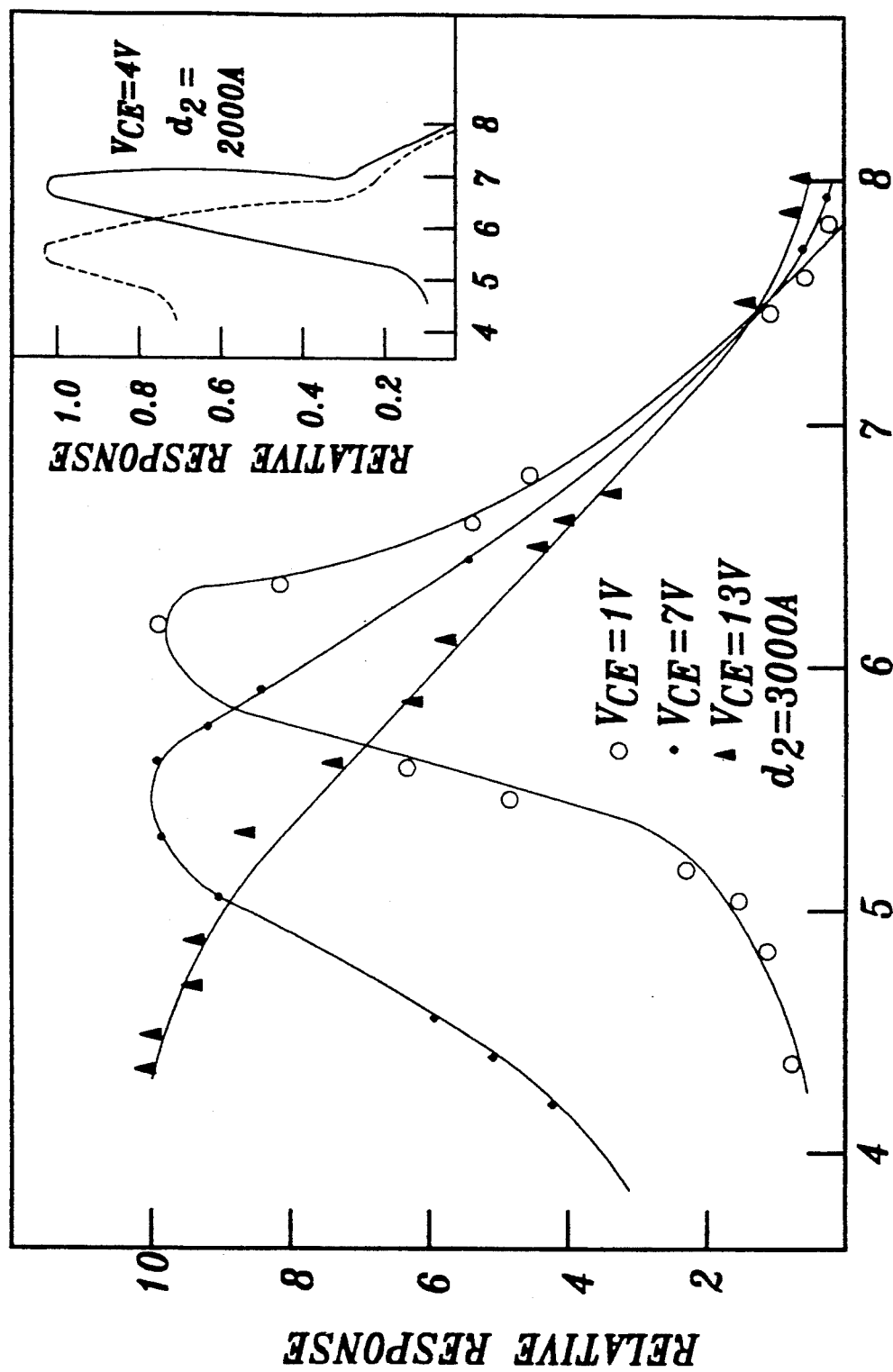
FIG. 5 shows the various normalized spectral responses with respect to different bias voltages $V_{CE}$ of the preferred phototransistor where the inserted diagram shows the spectral response change with respect to different collector i-layer thicknesses.

The relative spectral response to the phototransistor, determined over a wavelength range of 400–800 nm, is shown in FIG. 5. As a light source, a Bausch and Lomb monochromator with appropriate grating is used.

It is well known that the spectral response of a phototransistor exhibits failoff at both the long-wavelength regions and short-wavelength region. Generally, the former is due to either weak absorption or a finite carrier diffusion length, which is material dependent only, and the latter is limited by the bandgap of the window material or recombination loss. As can be seen in the FIG. 5 insert, when the device thickness changes from 2000 to 7000 Å, the peak response shifts from 5500 to 6500 Å, and the FWHM also becomes narrower. This is the result of the larger absorbing path in silicon, which especially favors long-wavelength light. A similar phenomenon can also be found from FIG. 5 when the bias voltage increases from 1 to 13 V. Both these thickness-dependent and voltage-dependent characteristics are related to the field strength. As is shown in FIG. 5, the relative response at short wavelengths increases with increasing field strength, while the response at the long wavelengths does not change. This effect can be explained by an improvement of recombination loss and carrier collection efficiency under a higher electric field. The peak response relative to the same normalized value at the different bias occurs at 610 nm at 1 V, and changes to 420 and 540 nm under 7-and 13-V biases, respectively.

In conclusion, the invention provides a new type of amorphous heterojunction phototransistor with the structure of glass/ITO/a Si(n+-i)/a-SiC(p+-i-n+)/Al. The new structure has been successfully fabricated. It is a majority-carrier device with very high optical gain under weak light illumination, and hence is suitable as a sensitive light detector. Both the voltage-dependent and thickness-dependent photo I-V characteristics provide flexibility for designing a voltage controllable color-sensitive detector.

I claim:

1. An amorphous Si/SiC heterojunction color-sensitive majority carrier bulk barrier phototransistor, comprising in order the following layers: a glass substrate; a collector electrode formed by an ITO coating on the glass substrate; an amorphous silicon n+ collector layer; an undoped amorphous silicon collector layer; a p+ amorphous silicon base layer; an amorphous undoped silicon carbide emitter layer; an amorphous n+ silicon carbide emitter layer; and an emitter electrode.

2. A color-sensitive phototransistor as recited in claim 1, wherein the undoped emitter layer has a thickness of between 100 and 500 Å, the undoped collector layer has a thickness of between 2000 and 7000 Å and the n+ silicon carbide emitter and n+ collector layers have thickness of 120 Å and 100 Å, respectively, and wherein there are no free carriers at any bias in the undoped emitter and collector layers and in the base layer.

3. A color-sensitive phototransistor as recited in claim 1, wherein the collector electrode is positively biased with respect to the emitter electrode such that, when light is introduced through the glass substrate, an optical gain is 40 at 5 microwatts of incident optical power, a 0.121 milliamp collector current, and a 14 volt collector-emitter bias voltage, and wherein a maximum said optical gain occurs at a wavelength of 610 nm at a bias of 1 V, and at a wavelength of 420 nm when the bias is change to 7 V.

* * * * *